United States Patent [19]
Zachai et al.

[11] Patent Number: 5,656,828
[45] Date of Patent: Aug. 12, 1997

[54] ELECTRONIC COMPONENT WITH A SEMICONDUCTOR COMPOSITE STRUCTURE

[75] Inventors: Reinhard Zachai, Guenzburg; Hans-Juergen Fuesser, Gerstetten-Dettingen; Tim Gutheit, Ulm, all of Germany

[73] Assignee: Daimler-Benz AG, Stuttgart, Germany

[21] Appl. No.: 432,859

[22] Filed: May 2, 1995

[30]  Foreign Application Priority Data

May 4, 1994 [DE] Germany ............... 44 15 600.6
May 4, 1994 [DE] Germany ............... 44 15 601.4

[51] Int. Cl.$^6$ ............................................. H01L 29/16
[52] U.S. Cl. .................... 257/77; 257/76; 428/408; 428/704; 428/446; 428/698; 428/457
[58] Field of Search ............................ 428/408, 446, 428/704, 698, 457; 257/77, 76

[56] References Cited

U.S. PATENT DOCUMENTS 4,707,384  11/1987  Schachner et al. ............... 428/408
5,082,522  1/1992  Purdes et al. ..................... 156/612

FOREIGN PATENT DOCUMENTS 24773    2/1991   Japan.
293080   2/1991   Japan.
112177   5/1991   Japan.

OTHER PUBLICATIONS

Popov, "Electron Cyclotron Resonance Plasmas Excited by Rectangular and Circular Microwave Modes", *J. Vac. Sci. Technol. A.*, 8(3), May/Jun. 1990.

Peter, G., A. Koller and S. Vazquez, "A New Electron Beam Evaporation Source for Si Molecular Beam Epitaxy Controlled by a Quadrupole Mass Spectrometer", *J. Vac. Sci. Technol. A.*, 9(8), Nov./Dec. 1991.

*Primary Examiner*—Archene Turner
*Attorney, Agent, or Firm*—Evenson, McKeown, Edwards & Lenahan P.L.L.C.

[57] ABSTRACT

The invention relates to a semiconductor composite structure for an electronic component. The semiconductor composite structure comprises a diamond layer, which is substantially undoped except for unavoidable impurities, one side of which is covered by a doped diamond-free semiconductor layer, with the layers being arranged on a growth substrate. The discontinuity which exists at the transition between the semiconductor layer and the diamond layer with respect to the conduction band and/or the valence band, is such that in the semiconductor layer charge carriers, which are excited optically and/or thermally, can be conducted in the valence band and/or conduction band of the undoped diamond layer with a decrease in their potential energy.

13 Claims, 2 Drawing Sheets

ELECTRONIC COMPONENT WITH A SEMICONDUCTOR COMPOSITE STRUCTURE

BACKGROUND AND SUMMARY OF THE INVENTION

The invention relates to an electronic component with a semiconductor composite structure comprising at least one diamond layer.

U.S. Pat. No. 5,117,267 discloses an electronic component which has a semiconductor composite structure. In the known semiconductor composite structure, in order to produce an electronic component, such as for example a transistor or a luminous diode, an n-doped cubic semiconductor layer of boronitride (C-BN) is arranged on one side of a p-doped diamond layer, and a p-doped C-BN layer is arranged on the other flat side of the p-doped diamond layer. These components thus comprise an active p-doped diamond layer, whereby at the transition between the n-doped C-BN layer and the p-doped diamond layer, a discontinuity of band energy levels is formed. In any event, the diamond layers, which are required for depositing electronically useful semiconductor composite structures, are of low crystal quality, relatively difficult to produce and expensive. Furthermore, semiconductor composite structures of this type also have a high resistance.

GB 2,228,949 A discloses a semiconductor composite structure for electronic components in which a diamond layer, which is n-doped with Si, is deposited by means of chemical vapor deposition on an inexpensive silicon substrate. By means of this n-doping of the diamond layer with silicon, the resistance of this semiconductor composite structure is smaller than semiconductor composite structures which have been n-doped as in the past by means of phosphorous and lithium. Nevertheless, the semiconductor composite structure still has a resistance which is too high.

It is therefore an object of the invention to provide a semiconductor composite structure of the type described above, which is characterized by a low resistance.

This object is achieved by the basic electronic component structure according to the invention, in which a doped semiconductor layer is adjacent to an undoped diamond layer. Due to the resulting band discontinuity of the valence band and/or conduction band at the transition between the semiconductor layer and the diamond layer, charge carriers generated optically and/or thermally in the doped semiconductor layer pass into the valence band and/or conduction band of the undoped diamond layer. In the diamond layer, which has a smaller energy gap between the conduction and valence bands, the charge carriers that have flowed out of or been taken up from the C-BN layer (which has a larger energy gap) form at least quasi-free charge carriers. Because they have a low activation energy, the resistance of semiconductor composite structures of this type is relatively small.

Furthermore, because the diamond layers of semiconductor composite structures of this type need not be doped, the associated problem of reproducibility, additional contamination, disturbance points for displacements and the like are at least decreased. Thus, the ionized charge carrier bodies cannot act, or act only to a small extent, as scattering centers for the charge carriers in the active diamond layer. It has further proven to be advantageous that in semiconductor composite structures of this type, n-doping, as well as p-doping, is possible in a simple and inexpensive manner.

BRIEF DESCRIPTION OF THE DRAWINGS

The invention will be explained in further detail hereinafter with reference to illustrative working embodiments shown in the accompanying drawings in which.

DETAILED DESCRIPTION OF THE DRAWINGS

Figure 1:
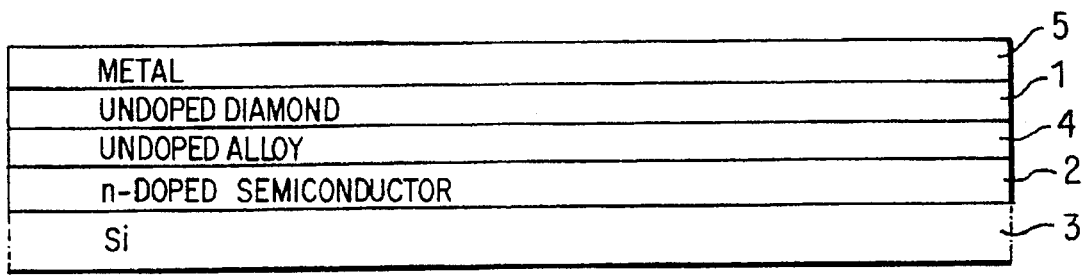
FIG. 1 shows a section through a simple semiconductor composite structure according to the invention, with four layers arranged on a growth substrate.

In FIG. 1 a semiconductor composite structure 10 is illustrated with four different layers deposited on a growth substrate 3. The deposition of the layers on top of the growth substrate is advantageously effected by means of CVD (chemical vapor deposition) and/or MBE (molecular beam epitaxy) and/or various derivative types of known epitaxy processes. (See, for example, German Patent Document DE 42 33 085 A1). Furthermore, it is also possible to produce a semiconductor composite structure 10 of this type, by applying an intermediate layer of crystalline cobalt disilicide ($CoSi_2$) or Si/C alloy over the silicon growth substrate 3, which (cobalt disilicide or Si/C alloy) exhibit a modified lattice fit (discussed hereinafter) with respect to the growth substrate 3 and with respect to the C-BN layer. The C-BN layer is then deposited on top of this intermediate layer, for which purpose material is vaporized by means of a laser from a body formed of hexagonal boronitride (BN), transported to the growth substrate 3 together with an $N_2$ gas stream, and deposited as a C-BN layer on the intermediate layer which is heated, for example, to 600° C.

In the embodiment of FIG. 1 a known type of n-doped semiconductor layer 2, for example, n-doped C-BN (see U.S. Pat. No. 5,117,267) is deposited on the growth substrate 3, which is formed of substantially monocrystalline silicon (preferably doped). This semiconductor layer 2 may comprise a single component (such as Si, Ge or the like), two components (binary system such as InP), three or more components (ternary or quaternary systems such as InGaAs, InGaAsP or the like). In the selection of the semiconductor layer 2, it is advantageous to seek out semiconductor systems which exhibit an acceptable lattice fit with the growth substrate 3, which expediently may have a (1,0,0) orientation, and may be made, for example, of GaAs or Si.

A good direct lattice fit means that the lattice constant of the semiconductor layer 2 varies only slightly from the lattice constant of the growth substrate 3. The size of the mismatch which is acceptable depends on the materials used; in general, however, it should be less than 1%, and advantageously less than 0.1%. Alternatively, a modified lattice fit may also exist between the semiconductor layer 2 and the growth substrate 3, in which the difference between a whole number multiple of the lattice constant of the first material and a whole number multiple of the lattice constant of the second material is less than 20% (preferably less than 10%, and ideally less than 1%) relative to the whole number multiple of the first material.

The whole number multiples of the lattice constants may be the same for the respective lattice constants of the semiconductor layer and the growth substrate, in which case we are concerned with a simple, direct lattice fit. If the whole number multiples are different, it is advantageous if they are less than 10, and preferably less than 5. One advantageous ratio in this regard is a 2:3 ratio.

In order to diminish any lattice mismatch between the semiconductor layer 2 and the subsequently deposited diamond layer 1, an intermediate layer 4 is deposited on the semiconductor layer 2. The intermediate layer 4 may be an alloy, which has a crystallographically regular alloy lattice with a diamond, calcium fluoride or zinc blende structure, and in which the composition of the alloy varies in the direction of the thickness of the layer (that is, it varies with distance from the semiconductor layer). A change in the lattice constant of the alloy lattice is associated with the change of its composition, which makes it possible to vary the lattice constant of the alloy within wide limits. Through this large variation of the lattice constant of the alloy lattice, a direct or a modified lattice fit between the semiconductor layer 2 and the diamond layer 1 can be realized in a simple manner by means of an intermediate layer 4 of this type. An alternative to the alloy is an intermediate layer 4 of cobalt disilicide ($CoSi_2$) which has a lattice mismatch smaller than 1% relative to a semiconductor layer 2 formed of C-BN.

On top of the diamond layer 1, which is deposited in substantially undoped form (except for unavoidable impurities), a metal layer 5 is applied, which advantageously functions as a gate, and which can be applied, for example, by vapor deposition. Any metal which is a good conductor, may be used for this metallic layer; for example, gold, silver and other noble and semiprecious metals are suitable.

Advantageously, when the intermediate layer 4 is formed as an Si—C alloy as mentioned previously, the crystal structure of crystalline silicon remains so that epitaxial growth of the diamond layer 1 on the alloy is facilitated. One process for producing such an intermediate layer 4 is as follows: A silicon atom beam is produced by evaporating solid silicon with an electron beam evaporator under ultra-high vacuum; a carbon atom beam is produced in a similar fashion. The ratio of Si to C can be varied from 0 to 1 by appropriately adjusting the two sources. A substrate of single crystal silicon is placed in the beam, and an alloy layer is deposited on the surface of the substrate. The lattice constant of the mixed layer varies in approximately linear manner between Si and diamond, in proportion to the carbon content (according to Vegard's Law). This can be measured by X-ray diffraction in layers produced in the foregoing manner.

If the gradient is selected small enough, the relaxation of the mixed layer (i.e. alloy layer), which is stressed relative to the silicon substrate, leads to a decrease in the lattice constant. And if this transition is sufficiently gentle, then the crystal structure will be retained.

In the composite structure described above, the material of the semiconductor layer 2 is fitted to the diamond layer 1 so that, as a result of the discontinuity of the conduction bands between layers 1, 2, optically and/or thermally activated charge carriers flow out of the small n-doped semiconductor layer 2, through the intermediate layer 4 into the conduction band of the undoped diamond layer 1 with a decrease in their potential energy (See, for example, U.S. Pat. No. 5,117,267 and German Patent Document DE PS 42 33 085 A1). In this way the diamond layer 1 of this semiconductor composite structure 10 becomes an n-type layer without direct n-doping.

It is also possible to produce semiconductor composite structures with p-type diamond layers without direct doping in the same manner. For this purpose the semiconductor layer must be fitted so that in this case, the band discontinuity of the valence bands which exists between these layers causes optically and/or thermally activated charge carriers of the semiconductor layer (which is p-doped), to flow through the alloy intermediate layer into the valence band of the undoped diamond layer with a decrease in their potential energy, producing a p-type diamond layer.

With a semiconductor composite structure of the type shown in FIG. 1, it is possible among other things to create electronic components such as luminous diodes which emit light in the blue range, or field-effect transistors, in which case the high heat conductivity of the diamond layer 1 is of great advantage.

Figure 2:
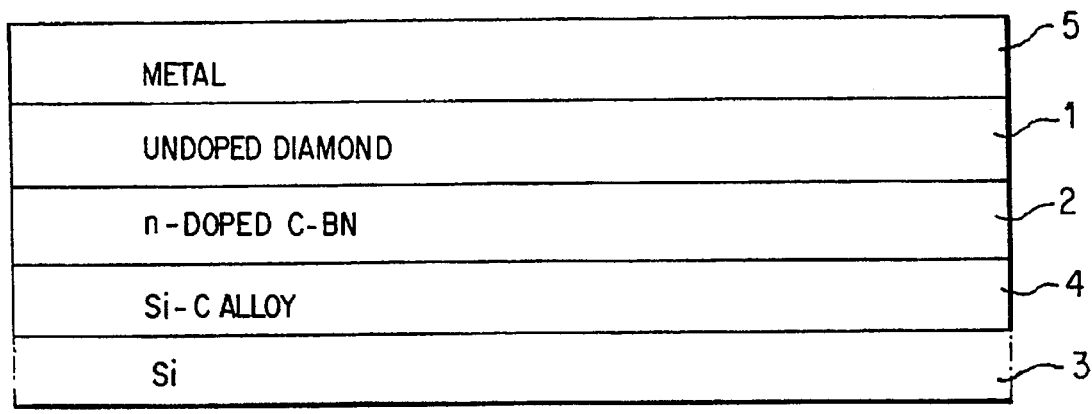
FIG. 2 shows another embodiment of the semiconductor composite structure according to the invention, with a different sequence of the layers of FIG. 1.

FIG. 2 shows another semiconductor composite structure 20 which also comprises a plurality of successively deposited layers on top of a growth substrate 3 composed of doped or undoped crystalline silicon. The first intermediate layer 4 deposited on the growth substrate 3 is formed of a carbon/silicon alloy which has a diamond-like or zinc blende-like alloy lattice in which the individual alloy atoms are arranged in a statistically distributed manner and in which the proportion of carbon atoms increases, and the proportion of silicon atoms decreases, as the thickness of the intermediate layer 4 increases, as discussed previously. As a result, the lattice constant of the intermediate layer 4 decreases from a value which corresponds approximately to the lattice constant of the growth substrate 3 formed of silicon, to a value which corresponds approximately to the lattice constant of cubic boronitride (C-BN). This is advantageous because an n-doped C-BN layer is subsequently deposited as a semiconductor layer 2 on top of the intermediate layer 4. The lattice constant of the C-BN layer differs from that of the silicon growth substrate 3 by more than 50%, in which case a directly deposited semiconductor layer 2 of C-BN would necessarily exhibit unsatisfactory quality.

On top of the semiconductor layer 2 of C-BN an undoped diamond layer 1 is arranged, on top of which a metal layer 5 which forms a gate is again deposited. As described previously, a band discontinuity is formed between the semiconductor layer 2 of C-BN and the diamond layer 1, and as a result charge carriers which are thermally and/or optically excited in the n-doped semiconductor layer 2 can pass into the conduction band of the undoped diamond layer 1 with a loss of their potential energy. In this manner, an n-type diamond layer 1 is also created in this example of a semiconductor composite structure 20. This arrangement has the advantage that the semiconductor layer 2 which donates the charge carriers is in direct contact with the diamond layer 1 which collects these charge carriers.

With a semiconductor composite structure of the type shown in FIG. 2, it is possible to make electronic components such as field effect transistors.

Figure 3:
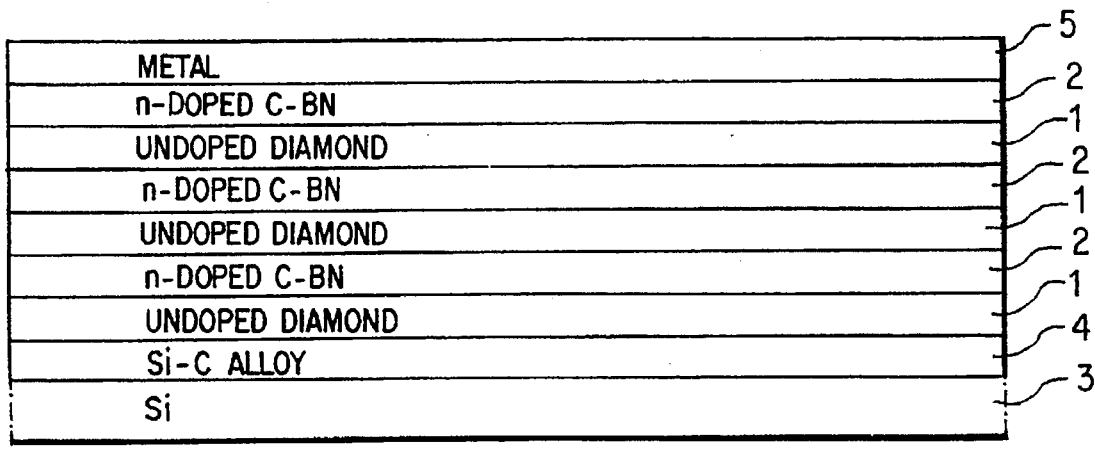
FIG. 3 shows a semiconductor composite structure according to the invention, with alternating semiconductor layers and diamond layers.

In FIG. 3 a semiconductor composite structure is illustrated which has alternating semiconductor layers 2 and undoped diamond layers 1. The alternating layers 1, 2 of n-doped boronitride and undoped diamond are arranged between a metal layer 5 on top of the last n-doped semiconductor layer 2 of C-BN, and the growth substrate 3, with a Si—C alloy applied to the growth substrate 3 as an intermediate layer 4. An undoped diamond layer 1 again follows the intermediate layer 4. This embodiment of the semiconductor composite structure 30 has the advantage that if adjacent semiconductor layers 2 have the same doping, the diamond layer 1 is contacted on both sides with charge carriers, which increases charge carrier density in the diamond layer 1.

With semiconductor composite structures of the type shown in FIG. 3, for example, electronic components such as field effect transistors or tunnel diodes can be realized. A semiconductor composite structure 30 of this type is particularly suitable for luminous diodes (LED) since both positive and negative charge carriers exist free in high density in the diamond layer 1 (which is actually undoped), and can recombine. In order to improve this process, it may be advantageous to create or build-in mechanical stresses inside the composite structure 30, which increase the value for this transition matrix element relating to this transition.

Figure 5:
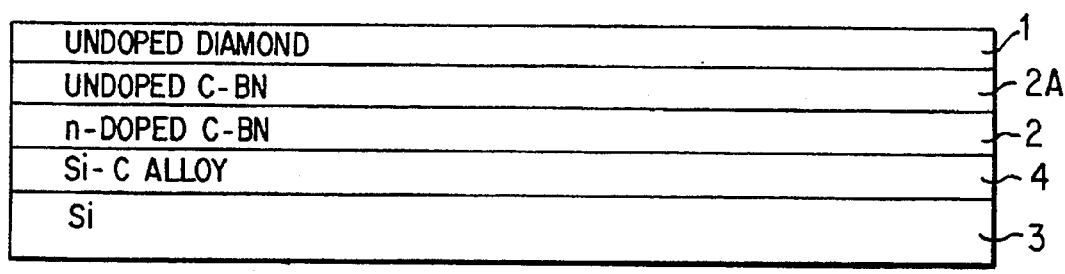
FIG. 5 shows another embodiment of the semiconductor composite structure according to the invention.

Another possibility is to arrange a thin undoped C-BN layer 2A between the doped C-BN layer 2 and the undoped intrinsic diamond layer 1 (FIG. 5), which results in doping of the overall C-BN layer that is inhomogeneous across its layer thickness. Thus, in such an arrangement, the scattering effect of the majority charge carriers is reduced.

Figure 4:
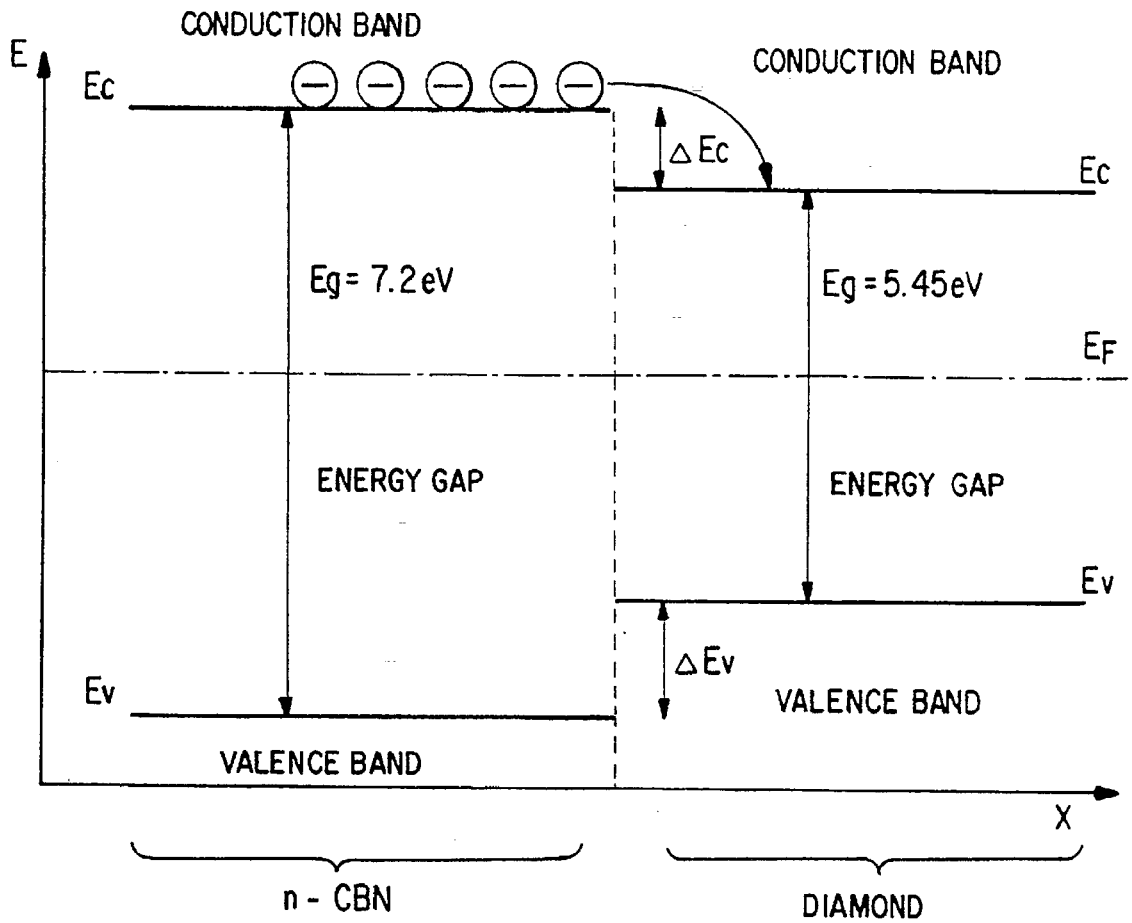
FIG. 4 shows a schematic illustration of the change of the valence band and conduction band in the vicinity of the transition from a diamond layer to a C-BN layer.

FIG. 4 is a diagramatic illustration which shows the discontinuity of the energy bands at the transition between a C-BN layer and a diamond layer, in which the upper region represents the conduction band, the lower region represents the valence band and the intermediate region represents the energy gap $E_g$. On the left of the band diagram, the energy gap in the C-BN has a value of approximately 7.2 eV, while the energy gap of the adjoining diamond has a value of approximately 5.45 eV. (The fermi energy level (broken line Ef) is shown as a common level.) The difference between the two band gaps is apportioned in roughly equal parts between the valence band (Ev) and the conduction band (Ec). The difference $\Delta Ec$ with respect to the conduction band Ec forms the threshold for the negative charge carriers, which are thermally excited, to be able to pass into the C-BN. At temperatures below 600° C. this difference $\Delta Ec$ with respect to the conduction band Ec is very much larger than the thermal energy of the charge carriers.

One possible process for producing a composite structure for the electronic components according to the invention is described hereinafter. A growth substrate 3 is installed in an MBE (molecular beam epitaxy) reactor and the reactor is evacuated. The pressure in the reactor should be less than $1*10^{-6}$ mbar. Pressures of approximately $10^{-8}$ mbar are advantageous. The surface of the growth substrate 3 may be previously cleaned by wet chemical techniques, and once again inside the MBE reactor simply by heating the growth substrate 3 to a temperature above 700° C. Cleaning may also be effected using a plasma generated by means of radio waves or microwaves, in which case it is advantageous to heat the growth substrate 3 and/or to apply a predetermined electric potential to it. Plasma cleaning of the substrate may be effected, for example, at a pressure of 29 mbar, in an $H_2$ gas stream at a flow rate of 300 sccm, at a microwave power of 750 watts, with heating to 900° C. for a duration of 10 minutes.

If the composite structure is produced, for example, with a microwave supported MWCVD (microwave chemical vapor deposition), the cleaning of the surface of the growth substrate inside a MWCVD reactor of this type may also be effected by means of a process gas.

After the cleaning of the growth substrate in the MBE reactor, pure silicon is deposited on its growth side from a solid silicon source, for example, commercially available high purity (99.99%) silicon. As described previously, the pure silicon is gradually replaced with carbon which is supplied from a solid carbon source, for example, commercially available high purity (99.99%) carbon. During the mixed deposition of carbon and silicon, a silicon-carbon alloy with a zinc blende-like or diamond-like alloy lattice in which the carbon atoms and the silicon atoms are statistically distributed, forms on the growth substrate 1. Deposition may be effected, for example, at a rate of 0.1 nm/s. The resulting layer thicknesses will typically range from 200 to 1000 nm.

In order that the lattice constant of the alloy lattice, which at the beginning of the alloy corresponds approximately to the lattice constant of the silicon growth substrate 3, can be decreased to the value of the lattice constant of a diamond, for example, the proportion of silicon in the alloy is decreased to approximately zero, while the proportion of carbon in the alloy, (i.e. in the intermediate layer 4) is increased by appropriate adjustment of the respective solid sources as the thickness of the alloy layer increases. For example, the source may be regulated by closed-loop feedback in order to maintain a constant mass spectroscopy signal for carbon at 12 amu [see Peter et al., *J. Vac. Sci. Tech. A*, Vol. 9, No. 6, pages 3061–63 (1991)].

It has thereby proved to be advantageous to vary the composition of the alloy within a thickness range of approximately 0.1 μm to 2 μm. The solid sources consist of high purity silicon (99.999%) or high purity carbon (99.99%). High purity graphite is particularly advantageous. The deposition of the intermediate layer takes place at a reactor pressure of less than $10^{-6}$ mbar. The temperature of the growth substrate 3 amounts to between 200° C. and 1200° C., particularly between 450° C. and 750° C. During the growth, the surface of the growing intermediate layer 4 can additionally be subjected to a flux of low-energy ions, for example ions having an energy of from about 0 to about 200 eV, in particular argon ions or nitrogen ions with an average energy of at most approximately 100 eV, in order to favorably influence the surface kinetics of the growing intermediate layer 4. A suitable flux of low energy ions may be produced, for example, with an ECR plasma source as described by Popov et al., *J. Vac. Sci. Tech. A*, Vol. 8, No. 3, pages 1009–12 (1990).

Because diamond has a higher surface energy than silicon, it is difficult to form diamond nuclei when attempting to deposit a diamond layer on a silicon substrate. However, the presence of carbon atoms in the surface layer of the growth substrate increases the surface energy of the substrate. Furthermore, by applying a negative bias voltage with respect to the plasma potential, carbon-containing positive ions are accelerated toward the surface (40 to 100 eV at a U-bias of 220 V). In this way it is possible to increase the surface energy of the substrate. Without the bias, no nucleation is observed, but if bias is applied, nucleation can be detected. These nuclei are, in part, built into the surface layers and above a critical size can develop into oriented crystallites. Even if carbon is already present in the surface of the substrate, this process will further promote the process of crystallite formation.

At very high carbon contents, the surface of a deposited carbon/silicon alloy increases in roughness as the growth of the layer proceeds until island growth occurs. Under normal conditions, a deposited alloy layer may have a surface roughness of about 5 nm after an etching step to clean the surface. In order to protect it, the intermediate layer 4 can be subsequently covered with a silicon sacrificial layer which is etched away before the subsequent diamond deposition. This avoids removal of the intermediate layer 4 during the hydrogen plasma cleaning with which the diamond deposition procedure typically begins. Otherwise, if the plasma cleaning were carried out too long or the intermediate layer 4 were too thin, the intermediate layer could be eaten away.

The deposition of the diamond layer takes place in the presence of a hydrogen/methane gas stream which contains between 0.1 and 10% methane, at a temperature between 200° C. and 900° C., preferably above 600° C. A suitable deposition procedure is disclosed, for example, in published German Patent Application No. DE 4,233,085. The starting crystal forming phase can be promoted by the application of a bias voltage between +50 V to −300 V, in particular at −150 V.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Semiconductor composite structure for an electronic component comprising:
   a growth substrate;
   at least one substantially undoped diamond layer; and
   at least one doped diamond-free semiconductor layer arranged in contact with said diamond layer and covering a surface thereof, said at least one diamond layer and said at least one semiconductor layer being arranged on said growth substrate, whereby a transition boundary between said at least one diamond layer and said at least one doped semiconductor layer exhibits a discontinuity of conduction and valence band energy levels, and through the course of said discontinuity, charge carriers which are excited optically or thermally can be diverted into the valence band or conduction band of the at least one undoped diamond layer, with a decrease in potential energy.

2. Semiconductor composite structure according to claim 1, comprising an alternating sequence of layers of doped semiconductor layer and undoped diamond layer.

3. Semiconductor composite structure according to claim 1, wherein the growth substrate of the semiconductor composite structure is a silicon or a GaAs substrate, preferably in orientation with respect to its Miller indices.

4. Semiconductor composite structure according to claim 1, wherein the growth substrate of the semiconductor composite structure is undoped.

5. Semiconductor composite structure according to claim 1, wherein the semiconductor layer is formed of boronitride (BN).

6. Semiconductor composite structure according to claim 5, wherein said boronitride is cubic boronitride (C-BN).

7. Semiconductor composite structure according to claim 1, wherein the semiconductor layer is n-doped.

8. Semiconductor composite structure according to claim 1, wherein said semiconductor layer is arranged on the growth substrate and the diamond layer is arranged on the semiconductor layer.

9. Semiconductor composite structure according to claim 1, wherein in order to improve a modified lattice mismatch between a whole number multiple of a lattice constant of the growth substrate and a whole number multiple of a lattice constant of the semiconductor layer an intermediate layer is arranged between the growth substrate and the semiconductor layer with the crystal lattice of the intermediate layer being at least similar to that of the semiconductor layer.

10. Semiconductor composite structure according to claim 9, wherein said intermediate layer is an alloy with alloy atoms statistically distributed within an alloy lattice thereof.

11. Semiconductor composite structure according to claim 1, wherein the semiconductor composite structure has a metal layer arranged on the diamond layer.

12. Semiconductor composite structure according to claim 1, wherein in order to decrease a modified lattice mismatch between a whole number multiple of a lattice constant of the diamond layer and a whole number multiple of a lattice constant of the semiconductor layer, an intermediate layer is arranged between the semiconductor layer and the diamond layer, said intermediate layer comprising an alloy having an alloy structure selected from the group consisting of a diamond structure, a zinc blende structure and a calcium structure, whereby charge carriers from the doped semiconductor layer can be conducted through the intermediate layer into the undoped diamond layer.

13. Semiconductor composite structure for an electronic component comprising:
   a growth substrate;
   at least one substantially undoped diamond layer; and
   at least one doped diamond-free semiconductor layer arranged in contact with said diamond layer and covering a surface thereof, said at least one diamond layer and said at least one semiconductor layer being arranged on said growth substrate, whereby a transition boundary between said at least one diamond layer and said at least one doped semiconductor layer exhibits a discontinuity of conduction and valence band energy levels, and through the course of said discontinuity, charge carriers which are excited optically or thermally can be diverted into the valence band or conduction band of the at least one undoped diamond layer, with a decrease in potential energy, wherein in order to decrease a modified lattice mismatch between a whole number multiple of a lattice constant of the diamond layer and a whole number multiple of a lattice constant of the semiconductor layer an intermediate layer is arranged between the semiconductor layer and the diamond layer, said intermediate layer comprising an alloy having an alloy structure selected from the group consisting of a diamond structure, a zinc blende structure and a calcium structure, whereby charge carriers from the doped semiconductor layer can be conducted through the intermediate layer into the undoped diamond layer, and the intermediate layer is formed of a silicon/carbon alloy having an alloy lattice selected from the group consisting of a diamond structure and a zinc blende structure, the proportion of carbon within the intermediate layer increasing as the spacing from the semiconductor layer increases, and the proportion of silicon decreasing correspondingly.

* * * * *